(12) United States Patent
Lilak et al.

(10) Patent No.: US 11,342,227 B2
(45) Date of Patent: May 24, 2022

(54) STACKED TRANSISTOR STRUCTURES WITH ASYMMETRICAL TERMINAL INTERCONNECTS

(71) Applicant: Intel Corporation, Santa Clara, CA (US)

(72) Inventors: Aaron Lilak, Beaverton, OR (US); Ehren Mannebach, Tigard, OR (US); Nafees Kabir, Portland, OR (US); Patrick Morrow, Portland, OR (US); Gilbert Dewey, Hillsboro, OR (US); Willy Rachmady, Beaverton, OR (US); Anh Phan, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/832,500

(22) Filed: Mar. 27, 2020

(65) Prior Publication Data
US 2021/0305098 A1 Sep. 30, 2021

(51) Int. Cl.
| | |
|---|---|
| *H01L 21/822* | (2006.01) |
| *H01L 21/311* | (2006.01) |
| *H01L 21/768* | (2006.01) |
| *H01L 23/522* | (2006.01) |
| *H01L 23/528* | (2006.01) |
| *H01L 27/088* | (2006.01) |
| *H01L 29/04* | (2006.01) |
| *H01L 29/16* | (2006.01) |

(52) U.S. Cl.
CPC .... *H01L 21/8221* (2013.01); *H01L 21/31116* (2013.01); *H01L 21/76802* (2013.01); *H01L 21/76877* (2013.01); *H01L 23/528* (2013.01); *H01L 23/5226* (2013.01); *H01L 27/0886* (2013.01); *H01L 29/04* (2013.01); *H01L 29/16* (2013.01)

(58) Field of Classification Search
CPC ................ H01L 21/8221; H01L 29/04; H01L 21/31116; H01L 21/76877; H01L 29/16; H01L 27/0886; H01L 23/5226; H01L 21/76802; H01L 23/528
See application file for complete search history.

(56) References Cited

U.S. PATENT DOCUMENTS

| | | | |
|---|---|---|---|
| 10,374,040 | B1 | 8/2019 | Chanemougame et al. |
| 2015/0311082 | A1 | 10/2015 | Bouche et al. |
| 2017/0287905 | A1 | 10/2017 | Morrow et al. |
| 2019/0214298 | A1 | 7/2019 | Stephens et al. |

FOREIGN PATENT DOCUMENTS

WO  2019172879  9/2019

OTHER PUBLICATIONS

Extended European Search Report from European Patent Application No. 20213351.8 dated May 25, 2021, 12 pgs.

*Primary Examiner* — Shahed Ahmed
*Assistant Examiner* — Vicki B. Booker
(74) *Attorney, Agent, or Firm* — Essential Patents Group, LLP

(57) ABSTRACT

One of a source, drain or gate terminal of an upper-level transistor structure is coupled to one of a source, drain or gate terminal of a lower-level transistor structure through an asymmetrical interconnect having a lateral width that increases within a dimension parallel to a semiconductor sidewall of the upper-level transistor by a greater amount than in an orthogonal dimension.

20 Claims, 11 Drawing Sheets

STACKED TRANSISTOR STRUCTURES WITH ASYMMETRICAL TERMINAL INTERCONNECTS

BACKGROUND

Demand for higher performance integrated circuits (ICs) in electronic device applications has motivated increasingly dense transistor architectures. Integrating multiple device levels within an IC is often referred to as monolithic 3D integration. Such integration is particularly challenging from the standpoint of interconnecting various terminals of the devices across multiple device levels.

A dielectric material between two device levels in an IC provides needed electrical isolation. An interconnect between terminals of different device levels may therefore rely on a via that is first etched through the intervening dielectric material, and filled with a conductive material. While it may be straight forward to land an interconnect via on a single device level having terminal structures at minimum lateral dimensions and/or the maximum density possible for a given interconnect technology node (e.g., the 30 nm interconnect node, 20 nm interconnect node, etc.), where two device levels each comprise transistor structures having the minimum lateral dimensions and/or the maximum structure density possible for a given technology node, an electrical interconnect between transistor terminals requires exceedingly high positional accuracy.

One technique for improving positional accuracy is to perform a via etch in a manner that is self-aligned to a terminal of an upper-level transistor. Such a self-aligned etch is however made more challenging by the significant aspect ratio of the upper-level transistor structure that is leveraged as a mask of the self-aligned etch. Because of the high aspect ratio, an anisotropic via etch can be expected to have a significantly tapered profile, for example with the diameter of the bottom of the via being significantly smaller than the diameter of the top of the via. Hence, even with only a very small misalignment between an upper-level transistor structure and a lower-level transistor structure, a device terminal interconnect that is perfectly aligned to an upper-transistor structure can fail to properly land on a terminal of a lower-transistor structure. IC yield may be significantly reduced upon such an occurrence. Stacked transistor interconnect structures and methods of fabrication, which can address one or more of the above issues would therefore be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
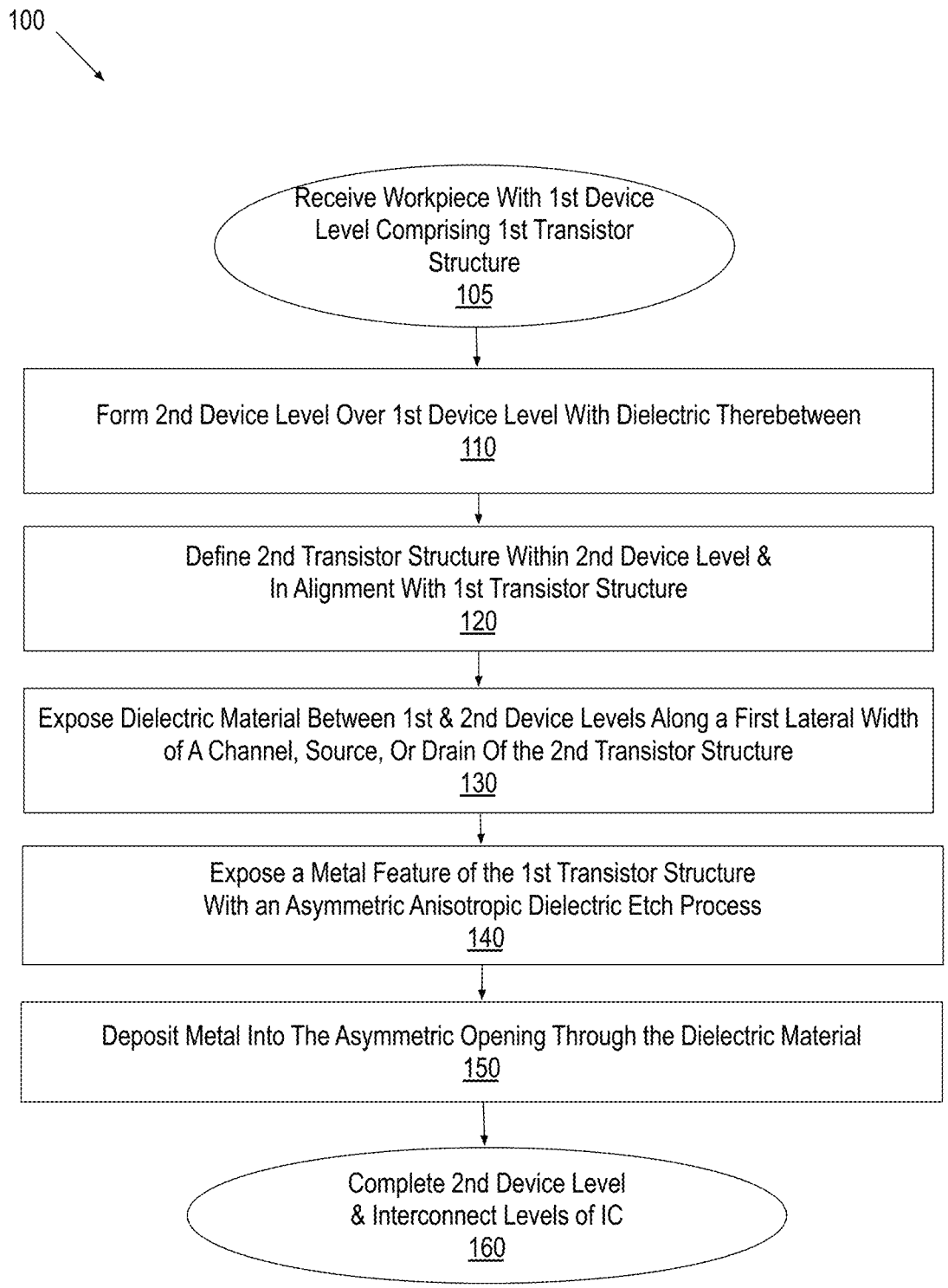
FIG. 1 is a flow diagram illustrating methods of fabricating stacked transistor structures comprising an asymmetrical terminal interconnect, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material disposed over or under another may be directly in contact or may have one or more intervening materials. Moreover, one material disposed between two materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In accordance with some embodiments herein, monolithic integrated circuitry includes stacked upper-level and lower-level transistor structures. There may be one or more dielectric material layers between upper-level transistor structure and a lower-level transistor structure. At least some of the dielectric material between the upper and lower transistor structures may be anisotropically etched asymmetrically, for example by orienting a workpiece to be non-orthogonal to a reactive ion flux. Selecting and/or varying an angle between the reactive ion flux and a plane of the second transistor during an etch of the dielectric material(s) may ensure lateral width of a via opening increases with depth within a first dimension, which is parallel to a semiconductor sidewall of the upper-level transistor. The lateral width of the via opening in an orthogonal, second dimension, may not increase with depth as significantly. According, a via between two transistor levels may be of sufficient bottom dimension to expose a terminal of the lower-level transistor even if not perfectly aligned with the second transistor structure, without sacrificing tight feature pitches within the second dimension.

A metal deposited into the asymmetrical via opening may be an asymmetrical interconnect feature that electrically connects together at least one of a source terminal, a drain terminal or a gate terminal of the upper-level transistor structure to at least one of a source terminal, a drain terminal or gate terminal of the lower-level transistor structure. As further described below, one or more of the upper-level terminals may be coupled with one or more of the lower-level terminals. For example, a via having a top aligned with a gate terminal of an upper transistor may be etched asymmetrically so the lateral width of the via opening increases within a first dimension, parallel to a semiconductor sidewall of the upper-level transistor, to expose both a gate terminal and a drain terminal of the lower-level transistor. Such a stacked transistor structure may find applications in current-mirror circuitry, for example.

FIG. 1 is a flow diagram illustrating methods 100 for fabricating stacked transistor structures comprising an asymmetrical terminal interconnect, in accordance with some embodiments. FIGS. 2A, 2B, 2C, 2D and 2E illustrate isometric cross-sectional views of a stacked transistor structure 201 evolving during the practice of methods 100 to include an asymmetrical terminal interconnect, in accordance with some embodiments.

Referring first to FIG. 1, methods 100 begin at input 105 where a workpiece with a first device level is received. In exemplary embodiments the device level includes one or more first transistor structures over an area of substrate, such as a semiconductor wafer, that is to become in IC chip. The transistor structures may be field effect devices (FETs), for example, and may be planar FETs, or non-planar FETs (e.g., finFETs, nanowire FETs, nanoribbon FETs, etc.). In the example illustrated in FIG. 2A, transistor structure 201 includes a plurality of non-planar bodies 215A, 215B, 215C that have been patterned into a front (top) side of substrate material layer 205. Bodies 215A-C may have any non-planar (3D) shape, but in the embodiments illustrated, bodies 215A-C are fins that have a longitudinal length (e.g., y-axis) that is longer than their transverse width (e.g., x-axis). Any patterning etch process suitable for the fin material(s) may be employed to form bodies 215A-C. Optionally, substrate material layer 205 is one substrate layer of a substrate that further includes one or more underlying substrate material layers 200. In some embodiments where substrate layer 200 is present, substrate layer 200 is an insulator such that substrate material layers 205 and 200 comprise a semiconductor-on-insulator (SOI) substrate structure. In other embodiments where substrate layer 200 is absent, substrate material layer 205 may be a top material layer of a bulk semiconductor substrate.

In some embodiments, substrate material layer 205 is a crystalline semiconductor. Although the crystalline semiconductor may be a polycrystalline thin film, in some exemplary embodiments the crystalline semiconductor is substantially monocrystalline. Non-planar bodies 215A-C may therefore be substantially monocrystalline, as well. In some embodiments, the crystallinity of substrate material layer 205 and non-planar bodies 215A-C is cubic with the top surfaces having crystallographic orientation of (100), (111), or (110), for example. However, other crystallographic orientations are also possible.

In some embodiments, substrate material layer 205 is a group IV semiconductor, such as, but not limited to substantially pure silicon (e.g., having only trace impurities), silicon alloys (e.g., SiGe), or substantially pure germanium (e.g., having only trace impurities). In other embodiments substrate material layer 205 is a Group III-V alloy with a first sub-lattice of at least one element from group III of the periodic table (e.g., Al, Ga, In, etc.), and a second sub-lattice of at least one element of group V of the periodic table (e.g., N, P, As, Sb, etc.). Non-planar bodies 215A-C may therefore also have any of these same compositions. Although bodies 215A-C may be of a substantially homogenous composition, bodies 215A-C may alternatively comprise one or more semiconductor heterojunctions that further include a first III-V compound semiconductor material on a second semiconductor material.

In some embodiments, substrate material layer 205 is an amorphous or polycrystalline semiconductor material. Such a material may have been deposited as a thin film upon substrate layer 200, for example with a chemical vapor deposition process. Thin film semiconductor material may have any composition that is suitable for at least one of a transistor channel, source, or drain. In some exemplary embodiments, substrate material 205 is an oxide semiconductor primarily including one or more metals, and oxygen. The metal(s) may be from the transition metals (e.g., IUPAC group 4-10) or post-transition metals (e.g., IUPAC groups 11-15). The metal oxide compounds may be suboxides ($A_2O$), monoxides (AO), binary oxides ($AO_2$), ternary oxides ($ABO_3$), and mixtures thereof. In advantageous embodiments, substrate material 205 includes oxygen and at least one of Mg, Cu, Zn, Sn, Ti, In, or Ga. In some specific embodiments, substrate material 205 comprises a tin oxide ($SnO_x$), such as Tin (IV) oxide, or $SnO_2$. In other embodiments, the tin oxide is Tin (II) oxide (SnO) or a mixture of SnO and $SnO_2$, where x may range between 1 and 2. In some other embodiments, substrate material 205 comprises a zinc oxide ($ZnO_x$), such as Zn(II) oxide, or ZnO. In other embodiments, the zinc oxide is zinc peroxide ($ZnO_2$) or a mixture of ZnO and $ZnO_2$, where x may range between 1 and 2. In some embodiments, substrate material 205 comprises $ZnO_x$ doped with In and Ga, for example. In some such embodiments, substrate material 205 is $InGaO_3(ZnO)_5$, often referred to as IGZO. In some other embodiments, substrate material 205 comprises titanium oxide ($TiO_x$), copper oxide ($CuO_x$).

In still other embodiments, substrate material 205 comprises a metal chalcogenide. Metal chalcogenides are compounds that may include a wide variety of d-block and/or p-block metal elements along with one or more chalcogen elements (S, Se, or Te). A metal chalcogenide channel semiconductor may be a dichalcogenide ($MC_2$). However, substrate material 205 need not be a dichalcogenide because a number of oxidation states are possible such that the resulting compound is better characterized as $MC_x$. In some advantageous embodiments, x is between 0.2 and 4.

Substrate material layer 205 may have any conductivity type and have any impurity doping level. In some embodiments, at least a top (front) portion of non-planar bodies 215A-C is intrinsic semiconductor or substantially undoped with electrically active impurities. In some NMOS embodiments, at least a top portion of non-planar bodies 215A-C is intrinsic silicon, or has a slight p-type conductivity. In some PMOS embodiments, at least a top portion of non-planar bodies 215A-C is intrinsic silicon, or has a slight n-type conductivity. Although bodies 215A-C may be of a substantially homogenous impurity doping, bodies 206 may alternatively comprise one or more semiconductor homojunctions that further include a first impurity doping concentration of first conductivity type (e.g., p-type or n-type) interfacing a second impurity doping concentration of a second, complementary conductivity type (e.g., n-type or p-type).

A dielectric material 210 is adjacent to the sidewall of a lower "sub-channel" portion of non-planar "fin" bodies 215A-C. Dielectric material 210 may be any dielectric material suitable for electrical isolation of transistors such as, but not limited to, SiO, SiON, SiOC, hydrogen silsesquioxane, methyl silsesquioxane, polyimide, polynorbornenes, benzocyclobutene, or the like. Terminal contact metallization crosses over non-planar bodies 215A-C and is in contact with at least a sidewall portion of bodies 215A-C. Source and drain contact metallization 220 is on opposite ends of non-planar bodies 215A-C. A gate electrode 235 is between source and drain contact metallization 220 and is adjacent to the sidewall of an upper "channel" portion of non-planar bodies 215A-C. Although dimensions can be expected to vary with technology node, in some exemplary embodiments where bodies 215A-C have a transverse width (e.g., x-dimension) of 2-15 nm, channel sidewall height is in the range of 30-50 nm while the sub-channel portion may have any sidewall height, such as 10-30 nm, or even 50 nm, or more.

One or more dielectric materials 225 are between sidewalls of gate electrode 235 and sidewalls of source and drain contact metallization 220. Dielectric materials 225 may be any dielectric material(s) known to be suitable as an insulator of a gate electrode, such as, but not limited to SiO, SiON, SiOC. Gate electrode 235 is part of a gate stack that further includes a gate dielectric material (not depicted). In some exemplary embodiments, the gate dielectric material is a high-k material (with a bulk relative permittivity greater than 8), and gate electrode 235 includes a metal having a work function suitable for semiconductor bodies 215A-C. Exemplary high-k materials include metal oxides, such as, but not limited to a metal oxide comprising predominantly aluminum (e.g., $Al_2O_3$), a metal oxide comprising predominantly magnesium (e.g., MgO), a metal oxide comprising predominantly lanthanum (e.g., $La_2O_3$), a metal oxide comprising predominantly hafnium (e.g., $HfO_2$), or an alloy metal oxide comprising significant portions of two or more of these metals (e.g., $HfAlO_x$). In some further embodiments, the high-k material further includes silicon. For example, metal silicates, such as, but not limited to $HfSiO_x$, or $TaSiO_x$ may also be suitable for some semiconductor compositions (e.g., Si, Ge, SiGe, III-V). Gate electrode 235 may advantageously include a layer of metal that has a work function below 5 eV and may include a semiconductor (e.g., polycrystalline silicon), an elemental metal layer, a metal alloy layer, or laminate structure of any of these materials. In some embodiments, the gate electrode is a metal nitride, such as TiN (e.g., 4.0-4.7 eV). Gate electrode 235 may also comprise Al (e.g., TiAlN). Other alloy constituents may also be employed in a gate electrode, such as, but not limited to, C, Ta, W, Pt, and Sn.

Source and drain contact metallization 220 may comprise an elemental metal or a metal alloy known to be suitable for forming a low resistance ohmic or tunneling contact to source and/or drain semiconductor material of non-planar bodies 215A-C. For example, source and drain contact metallization 220 may comprise at least one of Co, Ti, Vn, Ni, Pt. Source and drain contact metallization 220 may further comprise silicon (e.g., a metal silicide).

Figure 2A:
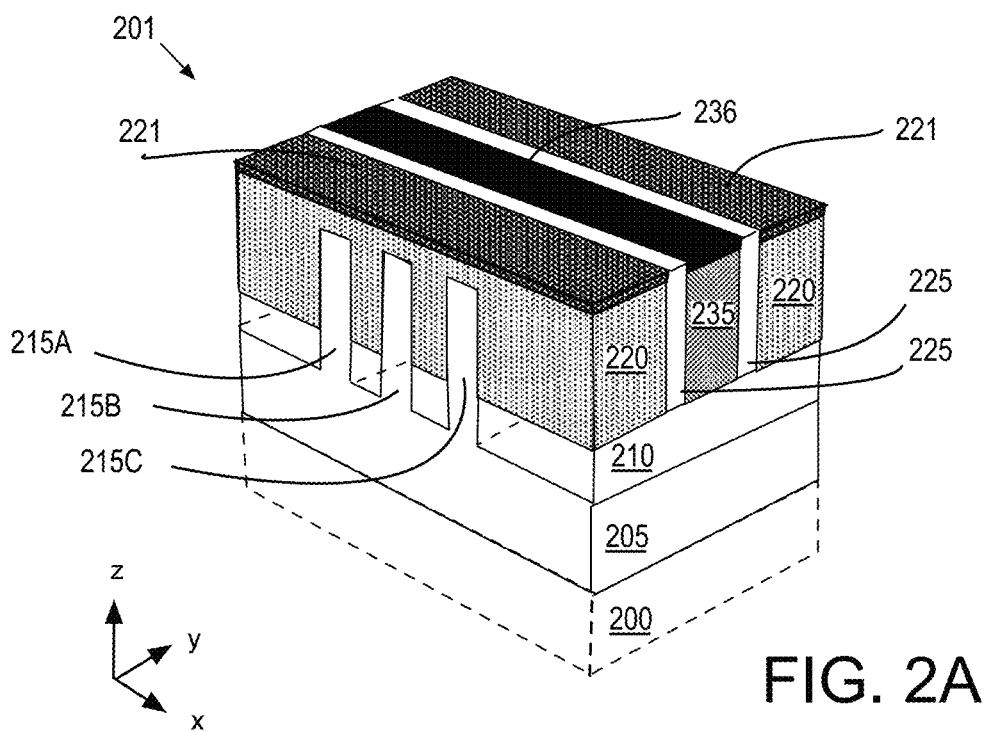
FIGS. 2A, 2B, 2C, 2D and 2E illustrate isometric cross-sectional views of a stacked transistor structure evolving to include an asymmetrical terminal interconnect, in accordance with some embodiments.

As further shown in FIG. 2A, transistor structure 201 further includes a hard mask material 221 over a top surface of source and drain contact metallization 220, and a hard mask material 236 over a top surface of gate electrode 235. Each of the hard mask materials 221 and 236 may have any composition known to be suitable for providing etch selectivity between each other so that they may serve as a selective etch stops, as described further below. For example, one of hard mask materials 221 and 236 may be predominantly silicon and oxygen (e.g., $SiO_2$) while the other may be predominantly silicon and nitrogen (e.g., $Si_3N_4$). Although a hardmask material is illustrated on each of the transistor terminal metals, one or more of the transistor terminals may lack such a hardmask.

Returning to FIG. 1, methods 100 continue at block 110 where a second device level is formed over the first device level. Block 110 may entail either exclusively thin film depositions, for example where the second device level comprises polycrystalline or amorphous semiconductor material. Alternatively, block 110 may entail any layer transfer and/or wafer bonding technique(s), for example where the second device level comprises monocrystalline semiconductor material.

At block 120, second transistor structures are fabricated within the second device level. In exemplary embodiments the second transistor structures a fabricated monolithically in substantial alignment with the first transistor structures so as be "stacked" over the first transistor structures. The second transistor structures may also be FETs, and may advantageously have the same architecture as the first transistor structures (e.g., planar FETs, or non-planar FETs (e.g., finFETs, nanowire FETs, nanoribbon FETs, etc.). Any transistor fabrication processes may be performed at block 120, for example to form one or more permanent or sacrificial structures of a transistor.

At block 130, dielectric material below the second transistor structures is exposed in alignment with a sidewall of a features in the second transistor structure. At least a portion of the second transistor structure is to mask a subsequent etch of the dielectric material. In some exemplary embodiments, a portion of the dielectric material adjacent to a sidewall of at least one of a source, drain, or channel semiconductor material of the second transistor structure is exposed at block 130. Block 130 may therefore entail removing a sacrificial material selectively from the second transistor structure so that the portion of the underlying dielectric material exposed is accurately aligned with features of the second transistor that are to be electrically interconnected to one or more terminals of the first transistor.

Figure 2B:
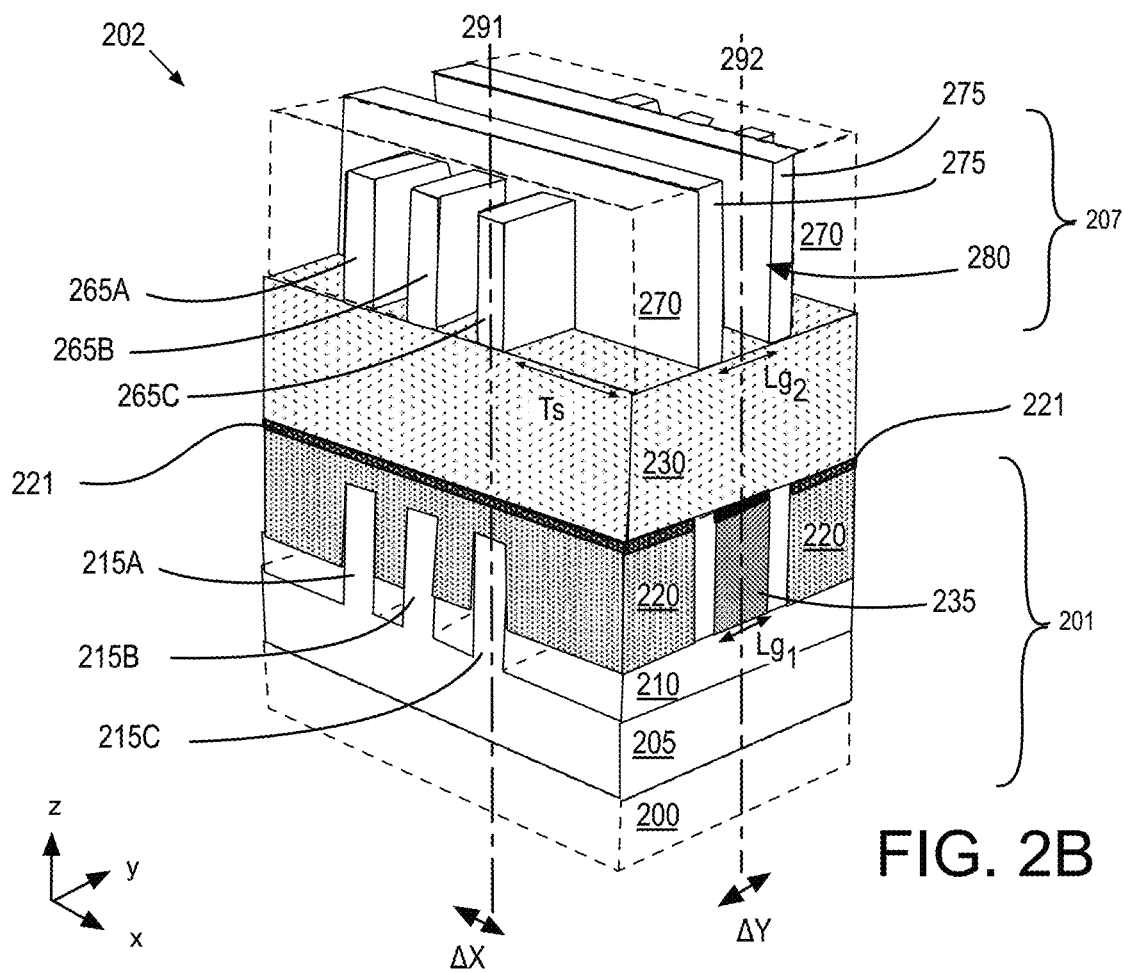

In the example illustrated in FIG. 2B, a stacked transistor structure 202 includes one or more dielectric materials 230 over transistor structure 201, and a transistor structure 207 over dielectric materials 230. Transistor structure 207 is substantially the same as transistor structure 201, with non-planar bodies 265A, 265B and 265C aligned substantially in parallel over non-planar bodies 215A, 215B and 215C, respectively. In some exemplary embodiments, non-planar bodies 265A-C comprise any suitable semiconductor material, such as any of those described above for semiconductor bodies 215A-C (e.g., crystalline or polycrystalline Group IV materials, amorphous metal oxide materials, etc.). In some specific embodiments where non-planar bodies 215A-C are monocrystalline silicon, non-planar bodies 265A-C are also monocrystalline silicon. In some other embodiments where non-planar bodies 215A-C are monocrystalline silicon, non-planar bodies 265A-C are polycrystalline silicon or metal oxide. Non-planar bodies 265A-C may be monolithically fabricated from a layer of semiconductor material according to any subtractive patterning process that is precisely aligned to one or more features of transistor structure 201. As such, both non-planar body 215C and non-planar body 265 share a non-planar body longitudinal centerline 291.

Terminal metallization structures of transistor structure 207 are also aligned substantially in parallel over terminal metallization structures of transistor structure 201. For example, transistor structure 207 further includes source and drain contact metallization 270, which is shown in dashed line for the sake of clarity. Source and drain contact metallization 270 may be of any composition, such as, but not limited to, any of those described above for source and drain contact metallization 220. Dielectric material 275 is between an inner sidewall of source and drain contact metallization 270 and an opening 280 where a gate electrode is to be formed. Opening 280 may have been formed at block 130 of methods 100 (FIG. 1), for example, by removing a sacrificial gate electrode around which dielectric material 275 was formed. With a permanent gate electrode yet to be formed in transistor structure 207, gate electrode opening 280 is perfectly (self-aligned) with a lateral width of a channel portion of non-planar bodies 265A-C. Gate electrode opening 280 is also aligned substantially in parallel over gate electrode 235, with the two sharing a terminal metal longitudinal centerline 292. Longitudinal centerlines 291 and 292 are therefore on substantially orthogonal planes.

As further shown in FIG. 2B, misregistration in a first dimension ($\Delta X$) of transistor structure 207 to transistor structure 201 will impact alignment of non-planar body longitudinal centerline 291 while misregistration in a second, orthogonal dimension ($\Delta Y$) of transistor structure 207 to transistor structure 201 will impact alignment of terminal metal longitudinal centerline 292. Terminal metal longitudinal centerline 292 bifurcates a lateral channel width of non-planar bodies 215A-C and 265A-C. Transistor structure 201 has a lateral channel width, or "gate length," $Lg_1$, and transistor structure 207 has a lateral channel width, or gate length, $Lg_2$. In the exemplary embodiment illustrated, gate lengths $Lg_1$ and $Lg_2$ are substantially equal. Even for embodiments where these lateral widths are not equal, the gate length of a given transistor structure is typically minimized as being an important aspect for transistor performance. With $Lg_1$ and $Lg_2$ being of minimal lateral widths (e.g., 5-10 nm), electrical interconnection between terminal metallizations of transistor structures 201 and 207 are very sensitive to misregistration $\Delta Y$, which could cause terminal metal longitudinal centerline 292 to be laterally offset by more than $Lg_1$ and/or $Lg_2$. Electrical interconnection between terminal metallizations of transistor structures 201 and 207 is less sensitive to misregistration $\Delta X$, being parallel the terminal metallization longitudinal lengths, which are larger than the lateral widths $Lg_1$ and/or $Lg_2$. Although not impacting electrical interconnection between terminal metallizations as significantly as misregistration $\Delta Y$, margins for misregistration $\Delta X$ will impact transistor spacing Ts, and therefore a minimum transistor pitch.

Returning to FIG. 1, methods 100 continue at block 140 where the upper-level transistor structure is employed as a mask to etch through the underlying dielectric material and expose a terminal metallization of the lower-level transistor structure in a manner that is self-aligned to features of the upper-level transistor structure. This self-aligned via etch may be rather more challenging than a typical lithographically define masked etch, at least in part because of the non-negligible topography of the upper-level transistor that may significantly increase the effective aspect ratio of the dielectric etch process. In exemplary embodiments, the dielectric etch process performed at block 140 is an anisotropic etch. Advantageously, the anisotropic dielectric etch performed at block 140, although capable of a high aspect ratio, avoids a tapered sidewall profile in at least the dimension having the greatest sensitivity in lateral alignment between the upper and lower transistor structures. This is because a smaller bottom via diameter associated with a tapered sidewall profile can compound misalignment sensitivities.

In exemplary embodiments, the etch performed at block 140 is an axially asymmetric anisotropic etch that forms an axially asymmetric opening through the dielectric material. In advantageous embodiments, the asymmetry of the dielectric etch process is aligned with the stacked transistor structures so as that the a lateral width of an etched opening increases with etch depth most significantly along the dimension of greatest alignment sensitivity. In some embodiments, the lateral width of an etched opening increases with etched depth so that the via profile is reentrant along the dimension of greatest alignment sensitivity. The etch performed at block 140 is therefore to be distinguished from an isotropic etch, which typically has an axially symmetric wine glass profile with a lateral width that decreases with etch depth. The etch performed at block 140 also to be distinguished from an anisotropic etch, which typically has an axially symmetric tapered profile with a lateral width that again decreases with etch depth.

The etch performed at block 140 may comprise energizing a high density plasma source and providing an electrical bias that propels an etchant species flux and/or an ion flux in a direction non-normal to a plane of the second device level (or workpiece), and more specifically at an angle of incidence that will increase the lateral width of an etched opening along the dimension of greatest alignment sensitivity (e.g., parallel a sidewall of a non-planar semiconductor body). The high density plasma source may comprise an inductively coupled plasma (ICP) source, for example, and an independent bias source may generate an electrical bias to impart a desired directional etchant species flux to the workpiece. One example of such as system is commercially available from Applied Materials, Inc. of CA, USA under the name of Raptor DRB®. For such an etch system, there is a process chamber separate from the plasma generation chamber, hence the workpiece doesn't see the plasma directly. Instead, an incident beam, similar to an ion implant tool carries the reactants, ions, neutrals etc. toward the workpiece surface at an incidence angle other than normal. With such etchant beam control, the beam and/or workpiece may be tilted and/or rotated during the etch process to alter the incidence angle of the etchant species flux relative to the stack transistor structure. In other embodiments, an ion beam etching (IBE) process may be employed at block 140. For such an etch system, the workpiece and/or the beam may again be tilted and/or rotated relative to the other during the etch process to alter the incidence angle of the ion flux relative to the stack transistor structure.

Figure 2C:
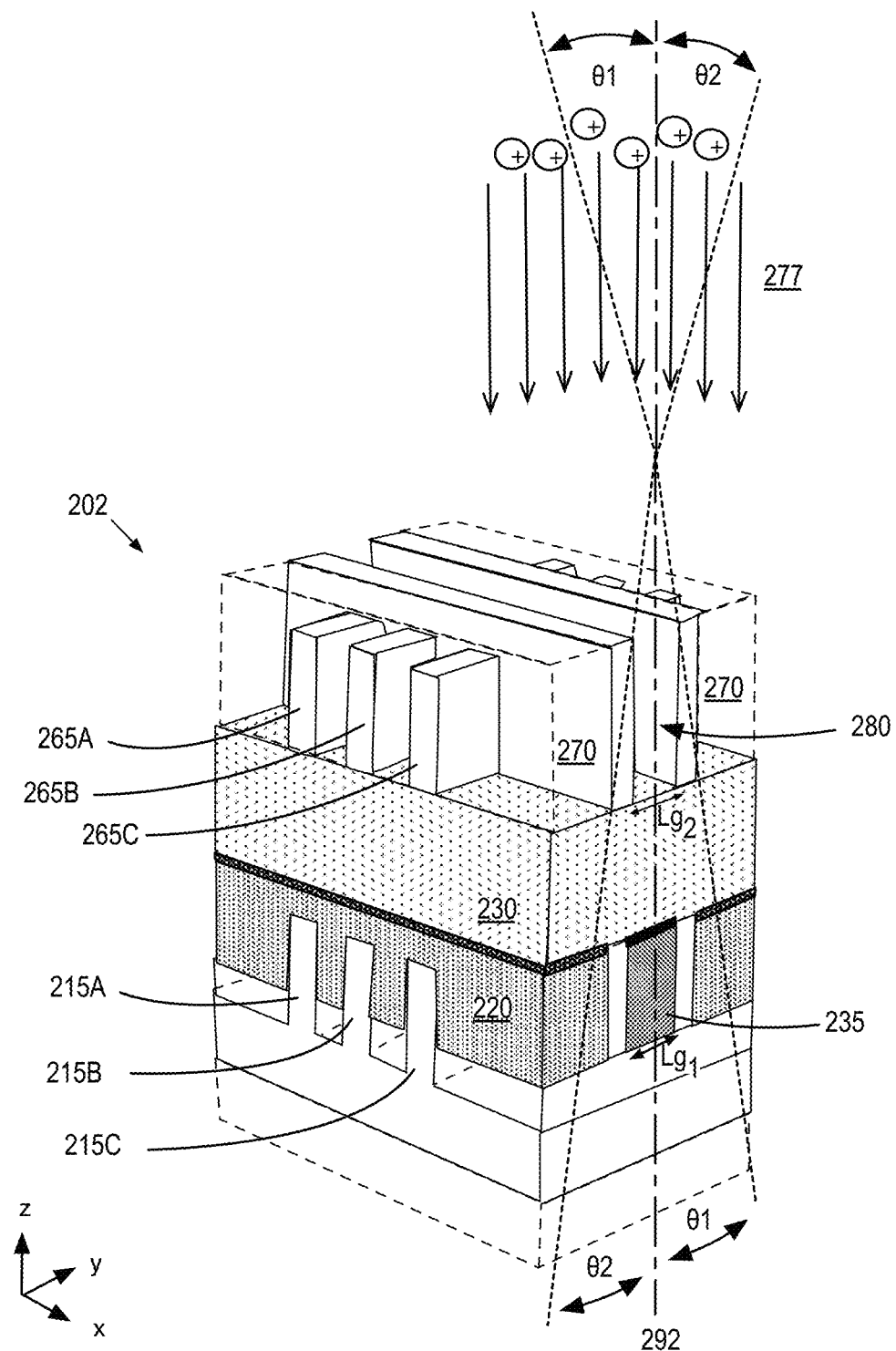

In the example illustrated in FIG. 2C, an ion and/or etchant species beam flux 277 has a dominant directionality along the z-axis. The stacked transistor structure 202 is to be oriented so that terminal metallization longitudinal centerline 292 is tilted relative to flux 277. In some embodiments, the stacked transistor structure 202 or beam flux 277 is tilted by a non-zero first half angle $\theta_1$ off a normal angle of incidence. In some embodiments, the tilt is two-dimensional, with $\theta_1$ being referenced to the orthogonal y-z plane of FIG. 2C. Although $\theta_1$ may vary, in exemplary embodiments $\theta_1$ is 5-30°. In some further embodiments, transistor structure 202 is further tilted off normal of flux 277 (e.g., off the z-axis) by a second non-zero half angle $\theta_2$. Although $\theta_2$ may also vary, in exemplary embodiments $\theta_2$ is 5-30°. Where $\theta_1$ and $\theta_2$ are equal, an etch profile may be substantially symmetric about centerline 292 within the y-z plane.

Where $\theta_1$ and $\theta_2$ are unequal, one may be 0° (e.g., no workpiece rotation), and the resulting etch profile is asymmetric the y-z plane.

Figure 2D:
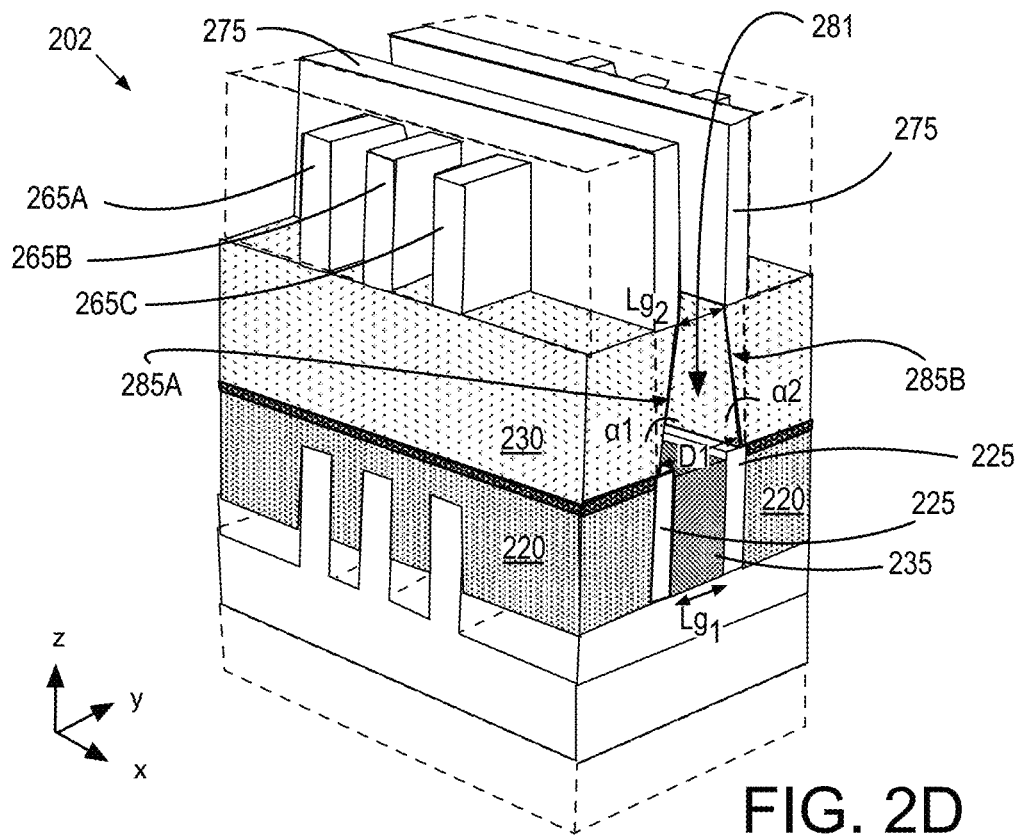

FIG. 2D illustrates a via opening 281 that results from etching through the thickness of dielectric material 230 with an axially asymmetric anisotropic etch process, in accordance with some embodiments. As shown, dielectric material 230 has a reentrant sidewall 285A that deviates from normal to a plane of the second device level by a sidewall angle $\alpha_1$, which is a function of the tilt half angle $\theta_1$. Within this same plane, dielectric material 230 has a reentrant sidewall 285B that deviates from normal to a plane of the second device level by a sidewall angle $\alpha_2$, which is a function of the tilt half angle $\theta_2$. In the illustrated example, via opening 280 has a trapezoidal profile in the y-z plane that is substantially parallel to the lateral width of the channel portion of non-planar bodies 265A-C. As further illustrated, a lateral width of top of via opening 281 is substantially equal to gate length $Lg_2$ (that was defined by opening 280), and increases to a bottom lateral width of D1 at an interface with dielectric material(s) 225. In this example, D1 is also larger than lateral width $Lg_1$. With a selective removal of hardmask material 236, a top surface of gate electrode 235 is exposed within a portion of the bottom of via opening 281. Although not visible in FIG. 2E, via opening 281 may have a very different profile within the x-z plane where there is no tilt. In absence of tilt within the x-z plane, the lateral width of via opening 281 does not increase with etch depth at the same rate as is the y-z plane. For some embodiments, the via opening 281 has a typically tapered anisotropic profile within the x-z plane and the bottom opening diameter is smaller than the top opening diameter.

Returning to FIG. 1, methods 100 continue at block 150 where metal, or any other material with suitable electrical conductivity, is deposited into the via opening formed at block 130. The material deposited at block 150 is to at least interconnect the exposed terminal of the lower-level transistor with another terminal of the upper-level transistor. In some exemplary embodiment, deposition of material at block 150 also forms a terminal of the upper-level transistor. The material deposited at block 150 may have any composition suitable as a gate electrode fill metal (e.g., it is not necessarily to further serve as a workfunction metal). Any deposition process may be practiced at block 150. Because of the reentrant sidewall profiles, in some advantageous embodiments a flowable and/or super conformal metal deposition process is employed to at least partially backfill the via opening formed at block 140.

Figure 2E:
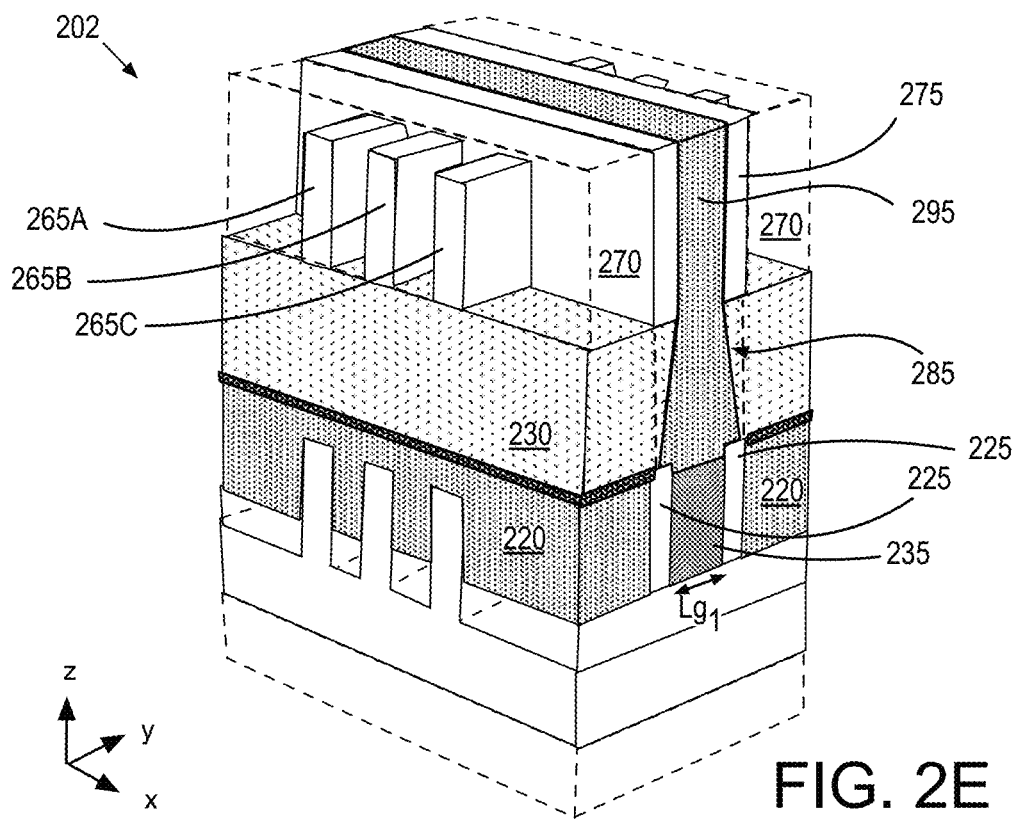

In the example illustrated in FIG. 2E, a stacked terminal interconnect 295 is shown to have substantially filled via opening 281. Stacked terminal interconnect 295 may be over a workfunction gate metal layer of a gate electrode stack, for example. Alternatively, stacked terminal interconnect 295 may be, or include, a suitable workfunction metal layer that is in contact with a gate dielectric material (not depicted) that was earlier formed over semiconductor material sidewalls of non-planar bodies 265A-C. FIG. 2E further illustrates the trapezoidal profile of stacked terminal interconnect 295 within the thickness of dielectric material 230. A trapezoidal profile is associated with a reentrant anisotropic etch profile resulting from the directional via etch process employed. Although the longitudinal centerlines through stacked terminal interconnect 295 and gate electrode 235 are perfectly aligned in the example illustrated, the trapezoidal profile of stacked terminal interconnect 295 nevertheless offers reduce electrical resistance relative to a symmetrically tapered gate terminal interconnect that would have a higher effective aspect ratio.

Returning to FIG. 1 after a terminal of the upper transistor has been interconnected to a terminal of the lower transistor, the second device level of the stacked transistor structure may be completed at output 160 according to any known techniques. Any number of interconnect metallization levels may be further fabricated over the stacked transistor structure, for example to interconnect other terminals of the stack transistor structure to various terminals of other transistor structures (stacked or otherwise).

Figure 3A:
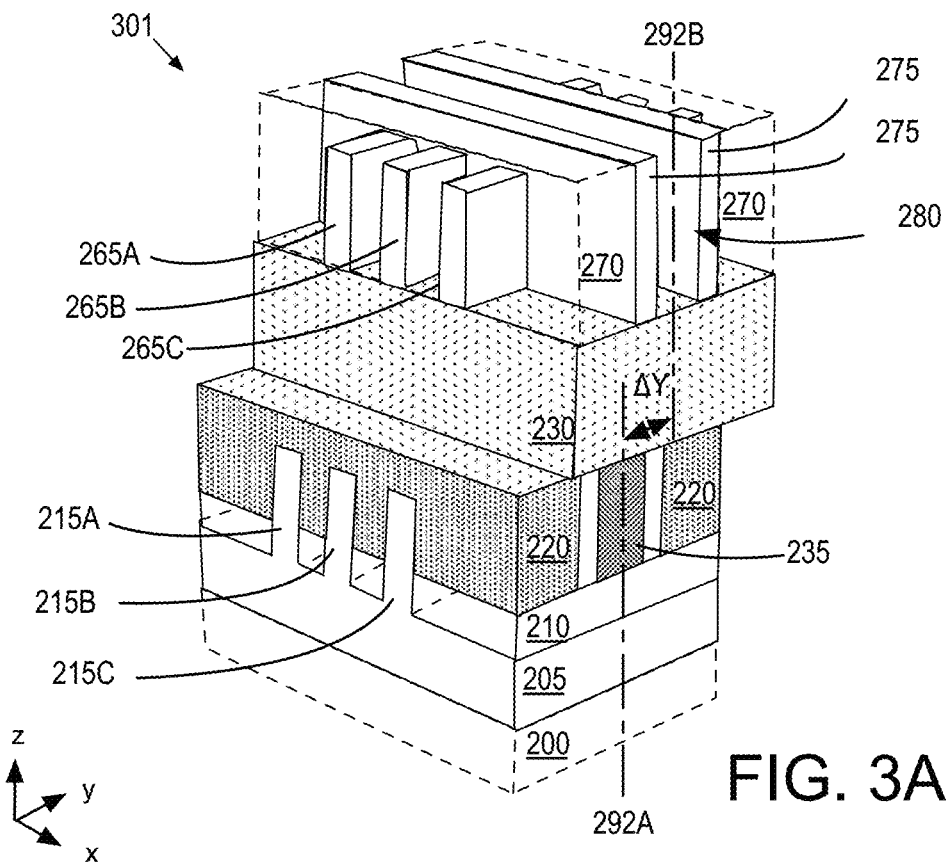
FIGS. 3A, 3B and 3C illustrate isometric cross-sectional views of a stacked transistor structure evolving to include an asymmetrical terminal interconnect, in accordance with some further embodiments.
Figure 3B:
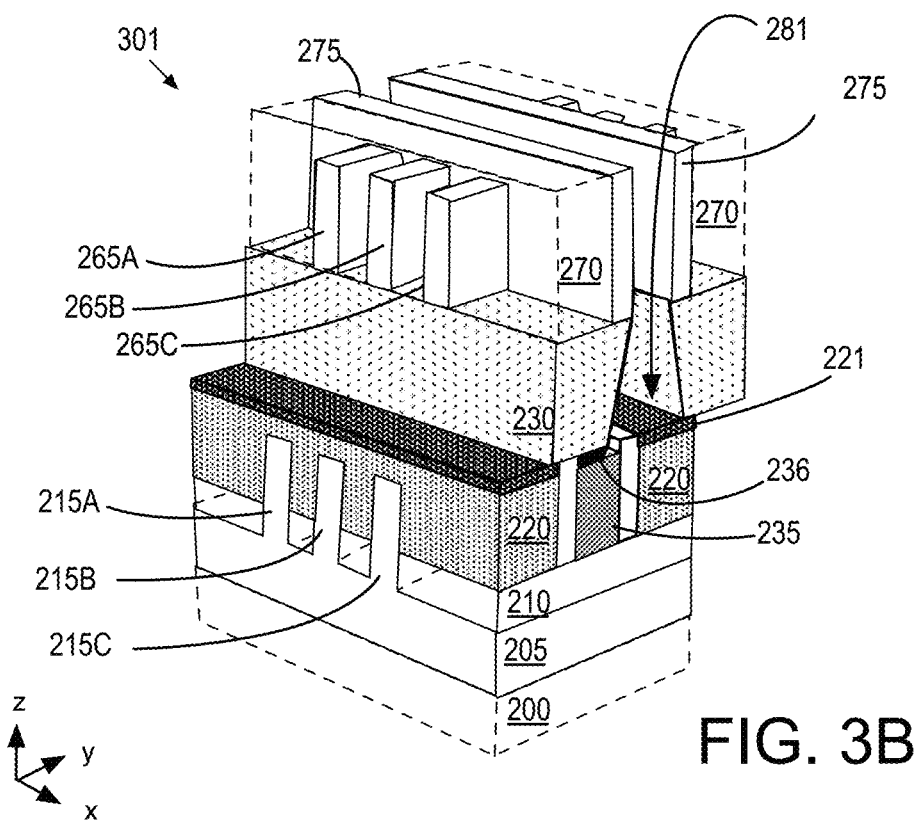
Figure 3C:
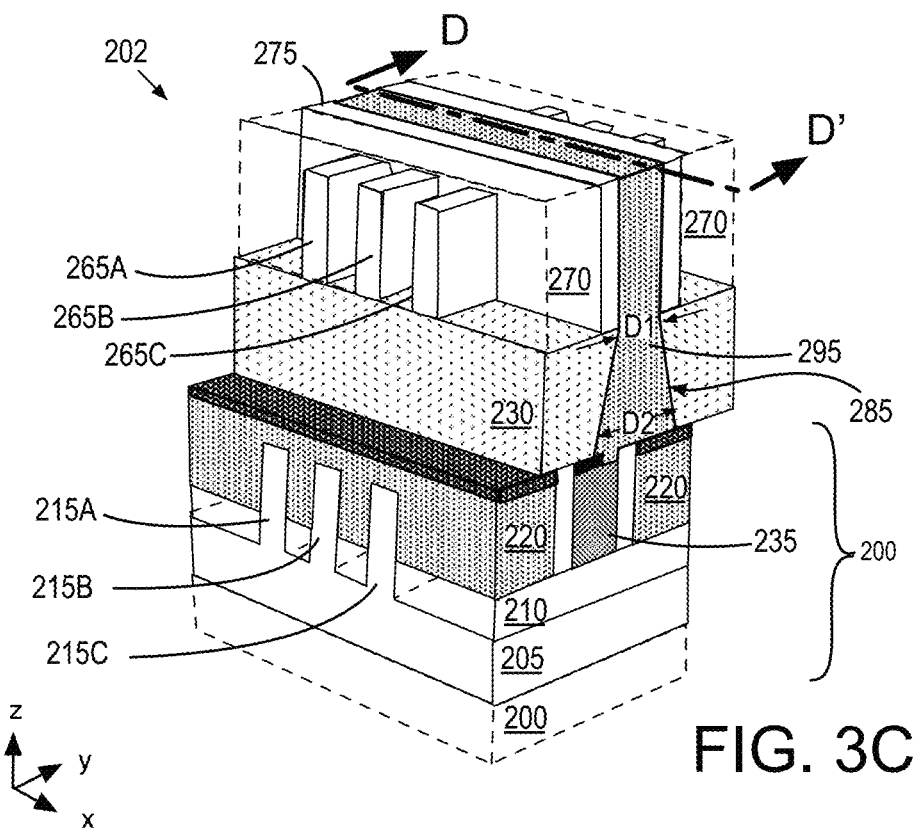

FIGS. 3A, 3B and 3C illustrate isometric cross-sectional views of a stacked transistor structure 301 evolving during the practice of methods 100 to include an asymmetrical terminal interconnect, in accordance with some further embodiments. Stacked transistor structure 301 is substantially the same as stacked transistor structure 202. Accordingly, reference numbers introduced in FIG. 2A-2C are retained in FIG. 3A-3C. Stacked transistor structure 301 illustrates an example where there is a significant $\Delta Y$ misregistration of the longitudinal centerline 292A of gate electrode 235 and centerline 292B of opening 280 where the gate electrode for the upper transistor is to be formed. As such, a directional etch in accordance with embodiments herein may enable the formation of a self-aligned interconnect between terminals of this stacked transistor structure that might otherwise result in an electrical open.

As further shown in FIG. 3B, substantially the same directional etch described above in the context of stacked transistor structure 202 has been performed on stacked transistor structure 301. Because of the $\Delta Y$ misregistration, via opening 281 exposes a significant portion of hard mask material 221 over source and drain metallization 220. However, because the directional dielectric etch expands the lateral width of via opening 281 within the y-z plane, at least a portion of gate electrode 235 is exposed. In the illustrated example, the directional via etch is completed with a selective etch of hardmask material 236 that does not also remove hardmask material 221. FIG. 3C further illustrates stacked terminal interconnect 295 with a profile in the y-z plane that has a top lateral width of D1 and a bottom lateral width of D2 that is significantly (e.g., 10%-50%, or more) larger than D1. Even with the misalignment, stacked terminal interconnect 295 is again in direct contact with gate electrode 235. Stacked terminal interconnect 295 is also in contact with hardmask material 221 (that is advantageously a dielectric material to prevent an electrical short to source and drain contact metallization 220).

Figure 3D:
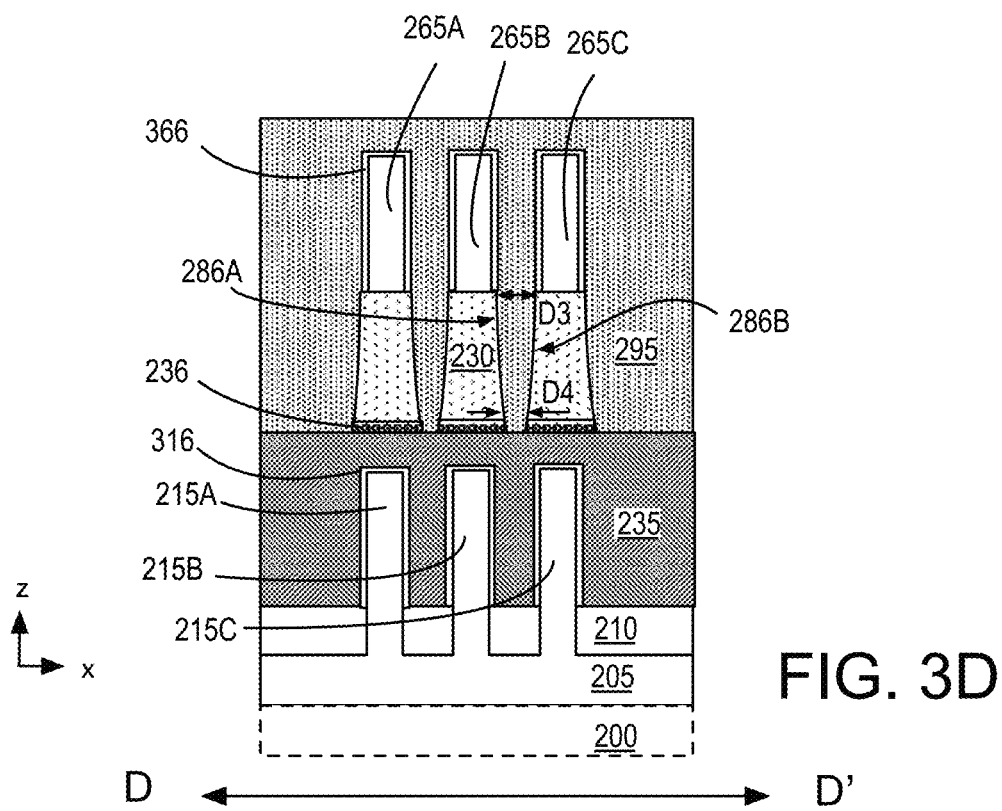
FIG. 3D is a cross-sectional view of the stacked transistor structure illustrated in FIG. 3C, in accordance with some embodiments.

FIG. 3D is a cross-sectional view of the stacked transistor structure 301 along the D-D' line also illustrated in FIG. 3C, in accordance with some embodiments. As shown in FIG. 3D, a gate dielectric 316 is between non-planar bodies 215A-C and gate electrode 235. A gate dielectric 366 is similarly between non-planar bodies 265A-C a stacked terminal interconnect 295. A workfunction metal (not depicted) may also be between gate dielectric 366 and stacked terminal interconnect 295, or stacked terminal interconnect 295 may comprise a workfunction metal layer (not depicted). In this example, dielectric material 230 under non-planar bodies 265A-C is retained as a result of the anisotropic etch of dielectric material 230. In this x-z dimension, dielectric material 230 has a tapered sidewall profile where top diameter D3 is larger than bottom diameter D4. Within the x-z plane, sidewalls 286A and 286B define a lateral width that decreases symmetrically from a center line of lateral width D3. Although D3 may vary, in exemplary embodiments, D4 is at least 10% smaller than D3. Hence, the via opening has a lateral width within the y-z plane that expands with etch depth while the lateral width within the orthogonal x-z plane expands by a lesser degree (e.g., less than 10%) and, more particularly for the illustrated embodiment, actually shrinks with etch depth. The via etch is therefore asymmetrically anisotropic, and stacked terminal interconnect 295, which at least partially fills the asymmetric via opening, is also asymmetric (e.g., with different profiles in x-z and y-z planes).

Figure 4A:
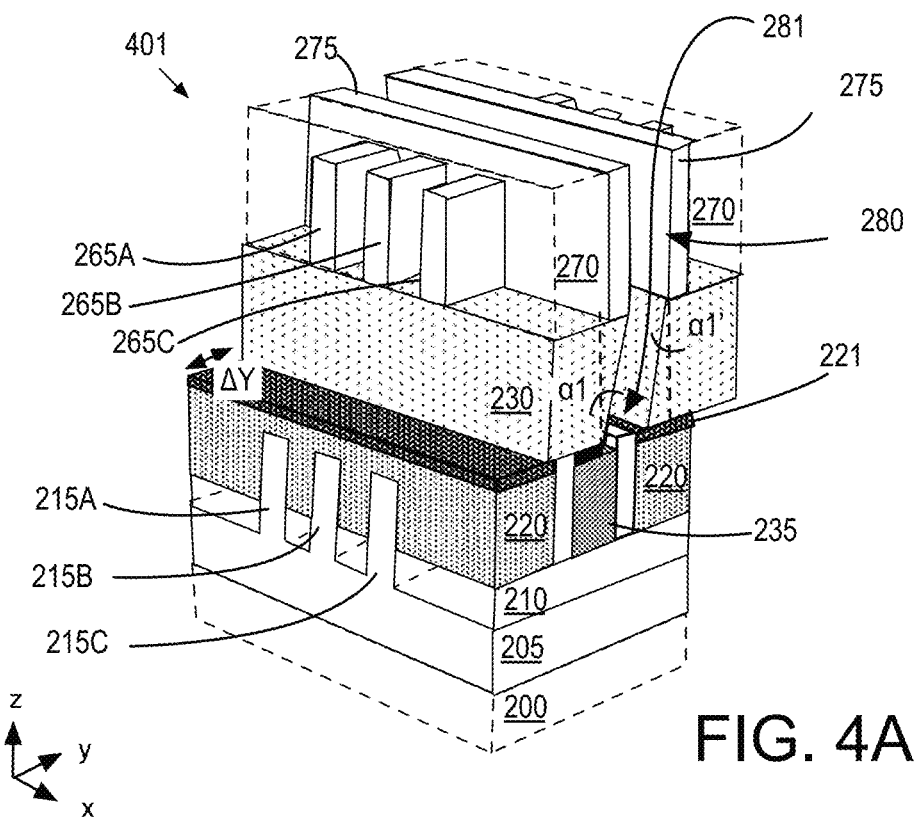
FIGS. 4A and 4B illustrate isometric cross-sectional views of a stacked transistor structure evolving to include an asymmetrical terminal interconnect, in accordance with some alternative embodiments.
Figure 4B:
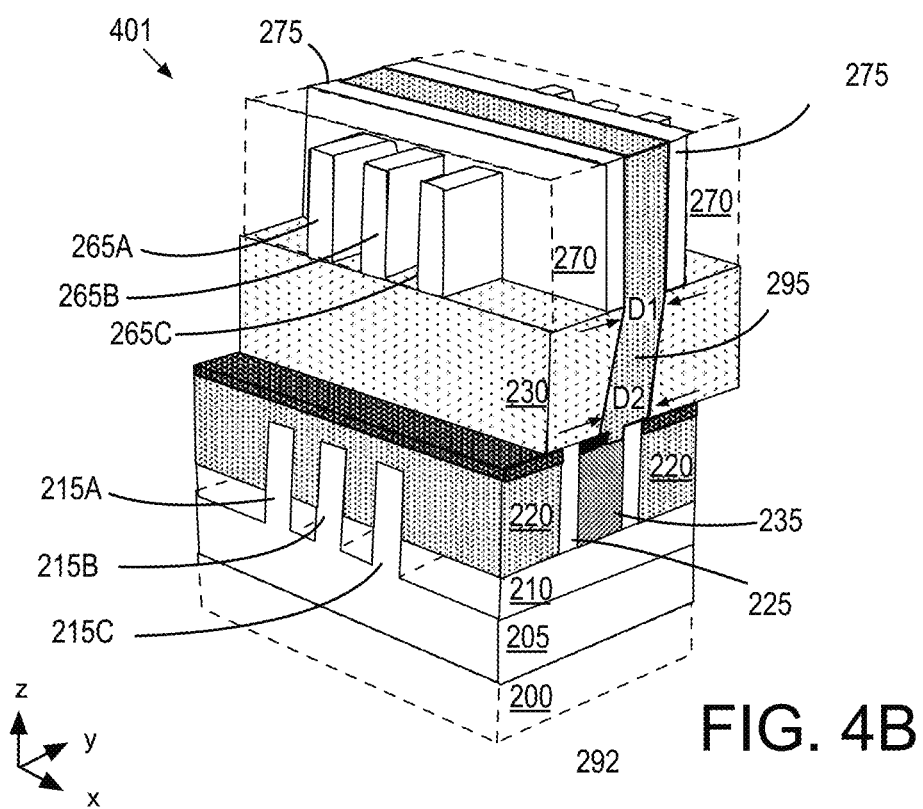

FIGS. 4A and 4B illustrate isometric cross-sectional views of a stacked transistor structure 401 evolving during the practice of methods 100 to include an asymmetrical terminal interconnect, in accordance with some alternative embodiments. Stacked transistor structure 401 is substantially the same as stacked transistor structure 301 and reference numbers introduced in FIGS. 2A-2C, and 3A-3C are retained in FIG. 4A-4B.

In FIG. 4A, substantially the same directional etch described above in the context of stacked transistor structure 301 has been performed on stacked transistor structure 401. In this example however, etchant flux has been directed toward only one side of the opening 280 through a tilt comprising only one non-zero half angle (e.g. $\theta_1 > 0°$). Via opening 281 is therefore asymmetrical within the y-z plane with the profile having a reentrant sidewall of angle $\alpha_1$ and a tapered opposing sidewall with a complementary positive slope of $\alpha_1'$.

The sloped trajectory of via opening 281 at least partially corrects for the $\Delta Y$ misregistration so that at least a portion of gate electrode 235 is exposed without exposing a large area of hard mask material 221 over source and drain metallization 220. Theoretically, if $\Delta Y$ misregistration is consistent over the entire area of a workpiece (e.g., wafer), the tilt direction and/or magnitude to be employed during the dielectric via etch may be determined as a function of a predetermined $\Delta Y$ misregistration. In the illustrated example, the directional via etch is completed with a selective etch of hardmask material 236 that may again be selective to hardmask material 221. FIG. 4B further illustrates that a profile of stacked terminal interconnect 295 within the y-z plane has a top lateral width D1 and a bottom lateral width D2. In this example lateral width D2 is approximately the same as top lateral width D1, but laterally offset by fraction of $\Delta Y$. The y-z plane profile of stacked terminal interconnect 295 in this example is more nearly a parallelogram although the y-z plane profile may range from a right trapezoid to a semi-elliptical, for example, depending on how the lateral width of via opening 281 increases asymmetrically from a center line of lateral width D1.

As noted above, one or more terminals of one transistor (upper or lower) in a stacked transistor structure may be electrically interconnected to one or more terminals of another transistor (upper or lower) in the stacked transistor structure with asymmetrical interconnect in accordance with embodiments herein. While the above examples have illustrated the interconnection of two gate terminals, in other embodiments two drain terminals are electrically interconnected by a similar interconnect structure. In still other embodiments, two source terminals are electrically interconnected by a similar interconnect structure. Notably, the ability to expand the lateral dimension of a transistor terminal interconnect in the manner described herein enables an interconnect structure that is completely self-aligned to a terminal of the upper-level transistor to contact multiple terminals of a lower-level transistor. Hence, in further embodiments, any combination of two or more terminals of a lower-level transistor are interconnected to at least one terminal of an upper-level transistor.

Figure 5A:
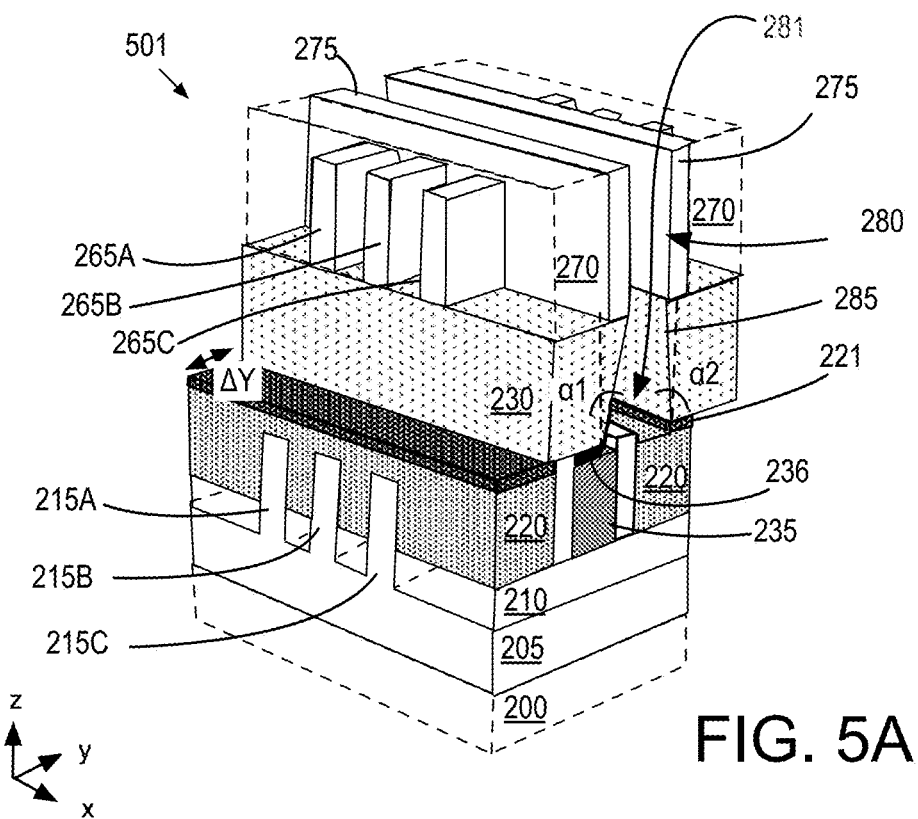
FIGS. 5A and 5B illustrate isometric cross-sectional views of a stacked transistor structure 501 evolving to include an asymmetrical terminal interconnect, in accordance with some alternative embodiments.
Figure 5B:
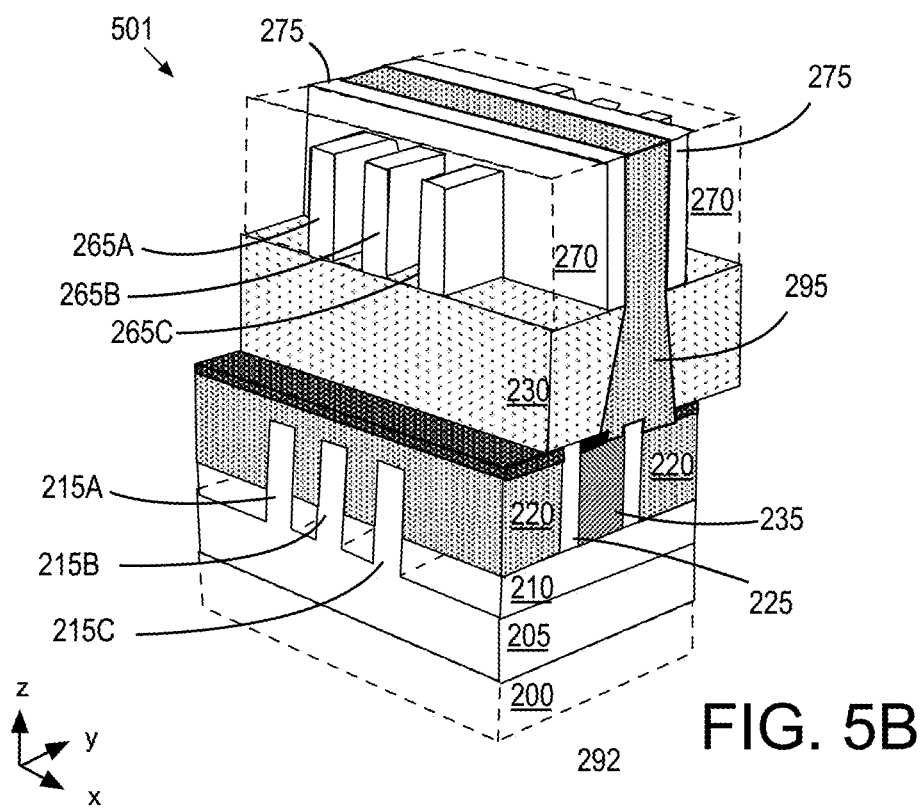

FIGS. 5A and 5B illustrate isometric cross-sectional views of a stacked transistor structure 501 evolving during the practice of methods 100 to include an asymmetrical terminal interconnect, in accordance with some alternative embodiments. Stacked transistor structure 501 is substantially the same as stacked transistor structure 301 and reference numbers introduced in FIGS. 2A-2C, and 3A-3C are retained in FIG. 5A-5B.

In FIG. 5A, substantially the same directional etch described above in the context of stacked transistor structures 202 and 301 has been performed on stacked transistor structure 401. In this example, via opening 281 is again self-aligned to (gate electrode) opening 280. A directional etch tilted about the y-axis (orthogonally to the y-z plane) generates sidewalls 285 having sidewall angles α1, α2, which may be equally reentrant, or not. As shown, both hardmask materials 221 and 236 have been removed to expose both a drain contract metallization 220 and gate metallization 235, respectively. As shown in FIG. 5B, stacked terminal interconnect metallization 295 is therefore in direct contact with both gate electrode 235 and drain contact metallization 220. Such a stacked transistor structure may be particularly advantageous as a current mirror block of an IC.

Figure 6:
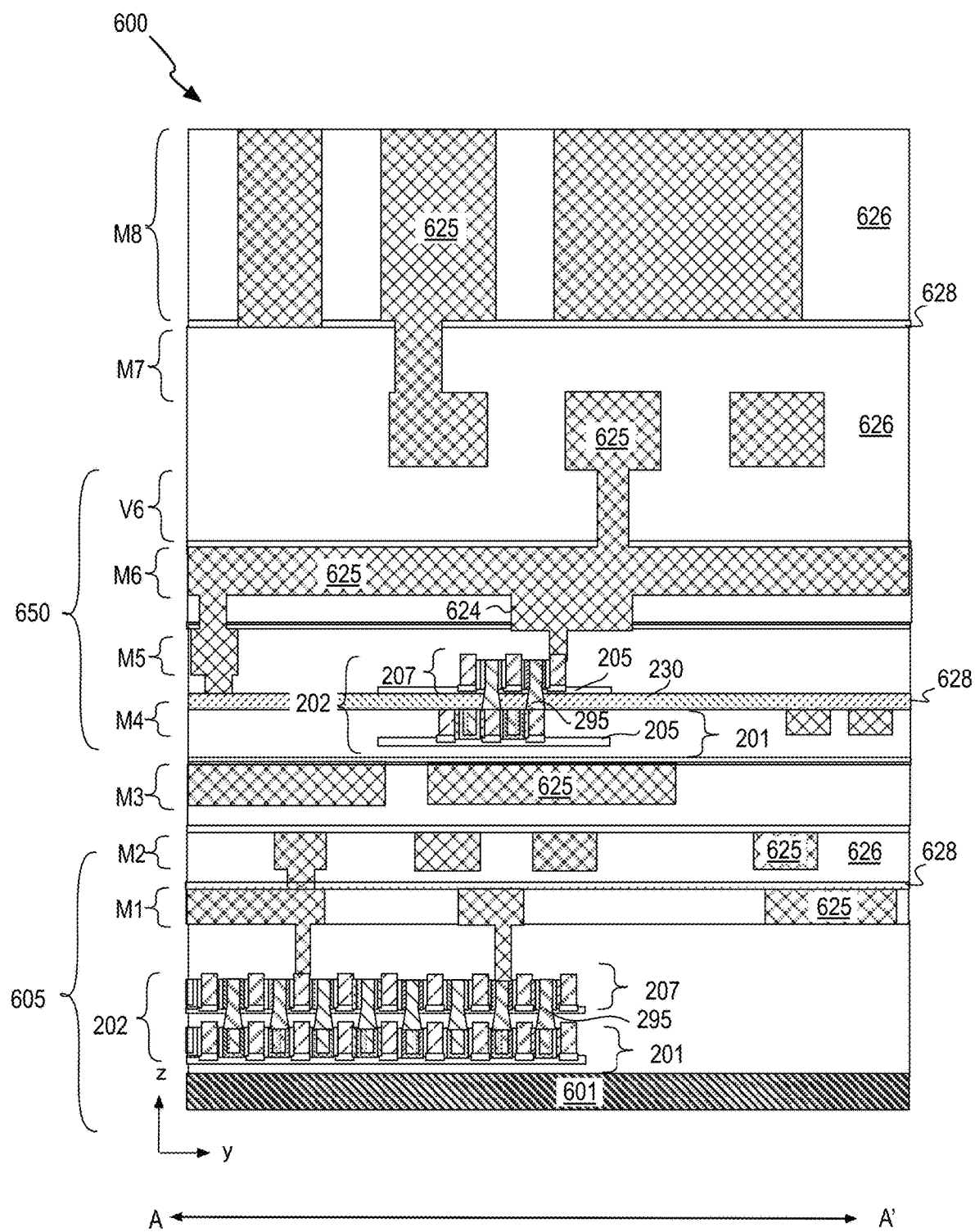
FIG. 6 is a cross-sectional view of a 3D IC structure with both single crystalline and polycrystalline embodiments of stacked transistor structures that include an asymmetrical terminal interconnect.

FIG. 6 is a cross-sectional view of an exemplary 3DIC structure 600 with both single crystalline and polycrystalline embodiments of stacked transistor structures that include an asymmetrical terminal interconnect. Although 3DIC structure 600 includes multiple implementations of stacked transistor structures having one or more of the features described above, a 3DIC may have only a single stacked transistor structure.

3DIC structure 600 illustrates a portion of a monolithic IC that includes a substrate material layer 205 that comprises FEOL device circuitry 605 fabricated over and/or on a single crystalline substrate 601. In this example, FEOL device circuitry 605 includes a plurality of stacked FET structures 202 that employ a monocrystalline semiconductor material for at least a channel region of each transistor. In other embodiments, FEOL device circuitry 605 includes other types of transistors (e.g., bipolar junction transistor, etc.). Stacked transistors 202 may each be substantially as described above, including a stacked terminal interconnect 295 having one or more of the features described above, for example.

Within 3DIC 600, FEOL device circuitry 605 may further include one or more levels of interconnect metallization 625 electrically insulated by dielectric materials 626, 628. In the exemplary embodiment illustrated, FEOL device circuitry 605 includes metal-one (M1), metal-two (M2) and metal-three (M3) interconnect metallization levels. Interconnect metallization 625 may be any metal(s) suitable for FEOL and/or BEOL IC interconnection. Interconnect metallization 625, may be, for example, an alloy of predominantly Cu, an alloy of predominantly W, an alloy of predominantly Ru, or an alloy of predominantly Al, etc. Dielectric material 626 may be any dielectric material known to be suitable for electrical isolation of monolithic ICs. In some embodiments, dielectric material 626 comprises silicon, and at least one of oxygen and nitrogen. Dielectric material 626 may be SiO, SiN, or SiON, for example. Dielectric material 626 may also be a low-K dielectric material (e.g., having a dielectric constant below that of $SiO_2$). Dielectric material 628 has a different composition that dielectric material 626, and may be of a composition that has a higher dielectric constant than that of dielectric material 626. In some examples where dielectric material 626 is predominantly silicon and oxygen (i.e., $SiO_x$), dielectric material 628 is predominantly silicon and nitrogen (i.e., $SiN_x$).

A BEOL device circuitry 650 is located over the FEOL device circuitry, with dielectric material 628 therebetween. BEOL device level 650 includes a plurality of stacked transistor structures 202, which in this implementation employ a thin film channel semiconductor material that may be polycrystalline or amorphous, for example. Stacked transistors 202 may each be substantially as described above, including a stacked terminal interconnect 295 having one or more of the features described above, for example.

BEOL device circuitry 650 may comprise any number of metallization levels over stacked transistor structures 202, such as a metallization level (e.g., M6) immediately above the metallization level (e.g., M5) in which stacked transistor structures 202 reside. As further shown, a via 624 electrically connects interconnect metallization levels to a stacked transistor terminal. Any number of interconnect metallization levels may be employed to couple BEOL circuitry 650 to the underlying FEOL device circuitry 605. For example, BEOL circuitry (e.g., M8) may be routed down through any number of metallization levels (e.g., M8-M3) to be in electrical communication with one or more FEOL stacked transistors 201.

In further embodiments, there may be multiple levels of BEOL stacked transistor structures located over the FEOL device level, each with dielectric material 626 and/or 628 therebetween. In other embodiments, a 3DIC may include one or more levels of the BEOL device circuitry 650 without any monocrystalline FEOL stacked transistor structures. For such embodiments, the BEOL stacked transistor structures may be over any substrate (e.g., polymer, glass, etc.). Hence, stacked transistor structures may be employed in conjunction with monocrystalline channeled devices, or not. In other embodiments, a 3DIC may include one or more levels of the FEOL stacked transistor structures without any BEOL stacked transistor structures.

Figure 7:
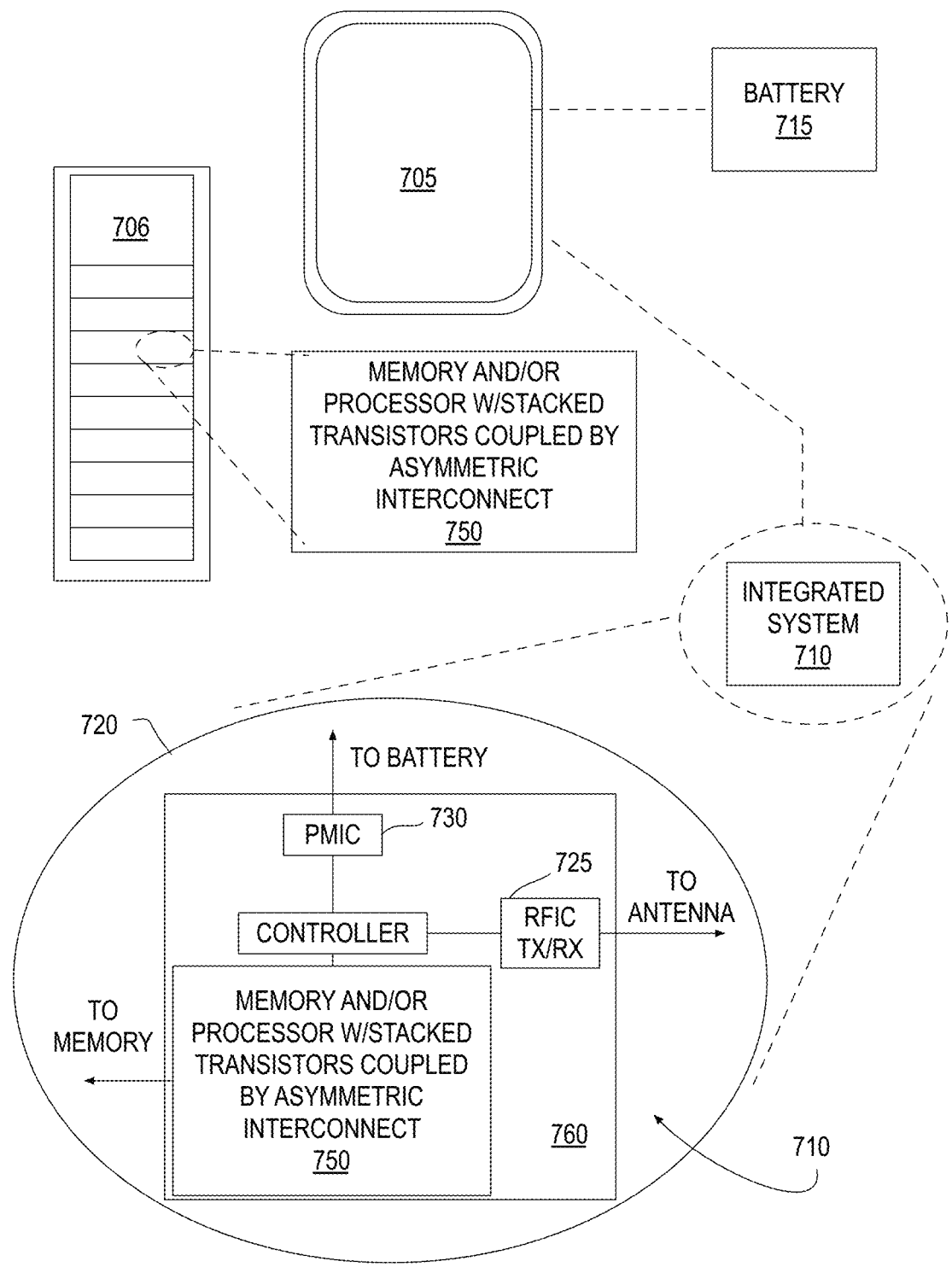
FIG. 7 illustrates a mobile computing platform and a data server machine employing an IC having stack transistor structures that include an asymmetrical terminal interconnect, in accordance with embodiments.

The stacked transistor structures with an asymmetrical terminal interconnect and the methods of manufacture described above may be integrated into a wide variety of ICs and computing systems that include such ICs. FIG. 7 illustrates a system in which a mobile computing platform 705 and/or a data server machine 706 employs an IC with stacked transistor structures with an asymmetrical terminal interconnect, for example in accordance with some embodiments described elsewhere herein. The server machine 706 may be any commercial server, for example including any number of high-performance computing platforms within a rack and networked together for electronic data processing, which in the exemplary embodiment includes a monolithic IC 750. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-level integrated system 710, and a battery 715.

Whether disposed within the integrated system 710 illustrated in the expanded view 720, or as a stand-alone packaged chip within the server machine 706, IC 750 may include memory circuitry (e.g., RAM), and/or a logic circuitry (e.g., a microprocessor, a multi-core microprocessor, graphics processor, or the like) at least one of which further includes stacked transistor structures, for example in accordance with some embodiments described elsewhere herein. IC 750 may be further coupled to a board, a substrate, or an interposer 760 that further hosts one or more additional ICs, such as power management IC 730 and radio frequency IC 725. RFIC 725 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 8:
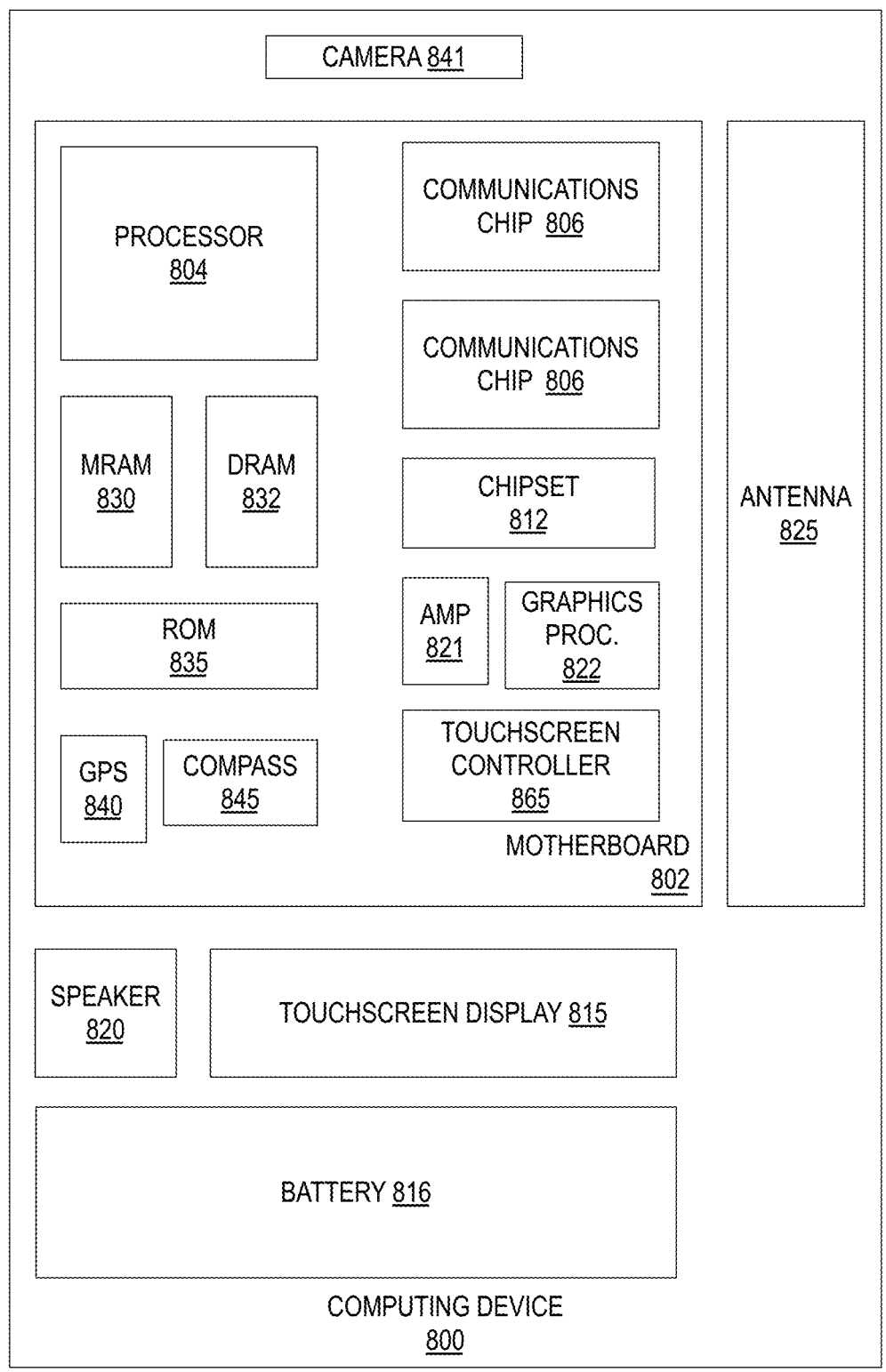
FIG. 8 is a functional block diagram of an electronic computing device, in accordance with some embodiments.

FIG. 8 is a functional block diagram of an electronic computing device 800, in accordance with some embodiments. Device 800 further includes a motherboard 802 hosting a number of components, such as, but not limited to, a processor 804 (e.g., an applications processor). Processor 804 may be physically and/or electrically coupled to motherboard 802. In some examples, processor 804 is part of a monolithic IC structure including stacked transistors with asymmetrical terminal interconnects, as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 806 may also be physically and/or electrically coupled to the motherboard 802. In further implementations, communication chips 806 may be part of processor 804. Depending on its applications, computing device 800 may include other components that may or may not be physically and electrically coupled to motherboard 802. These other components include, but are not limited to, volatile memory (e.g., DRAM 832), non-volatile memory (e.g., ROM 835), flash memory (e.g., NAND or NOR), magnetic memory (MRAM 830), a graphics processor 822, a digital signal processor, a crypto processor, a chipset 812, an antenna 825, touchscreen display 815, touchscreen controller 865, battery 816, audio codec, video codec, power amplifier 821, global positioning system (GPS) device 840, compass 845, accelerometer, gyroscope, speaker 820, camera 841, and mass storage device (such as hard disk drive, solid-state drive (SSD), compact disk (CD), digital versatile disk (DVD), and so forth, or the like.

Communication chips 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 806 may implement any of a number of wireless standards or protocols, including, but not limited to, those described elsewhere herein. As discussed, computing device 800 may include a plurality of communication chips 806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) structure, comprises a first transistor structure comprising a first metal feature adjacent to a first lateral width of a first channel, source, or drain semiconductor material sidewall. The a dielectric material over the first transistor structure, and a second transistor structure over the dielectric material. The second transistor structure comprises a second metal feature over a second lateral width of a second channel, source, or drain semiconductor material sidewall. The second metal feature extends through the dielectric material and is contact with the first metal feature. The second metal feature has a lateral width that increases with depth in the dielectric material by a greater amount in a first dimension than in a second, orthogonal, dimension. The first dimension is substantially parallel to the first and second lateral widths.

In second examples, for any of the first examples, within the first dimension, the lateral width of the second metal feature increases from the first lateral width to a second lateral width that is at least 50% larger than the first lateral width.

In third examples, for any of the second examples, within the second dimension, the lateral width of the second metal feature increases from a third lateral width to a fourth lateral width that is no more than 10% larger than the first lateral width.

In fourth examples, for any of the third examples, the fourth lateral width is smaller than the third lateral width by at least 10% of the third lateral width.

In fifth examples, for any of the first through fourth examples lateral width increases within the first dimension asymmetrically from a center of the second lateral width, and wherein lateral width varies within the second dimension symmetrically from a center of the third lateral width.

In sixth examples, for any of the fifth examples the center of the second lateral width is laterally offset in a first direction from a center the first lateral width, and lateral width increases more in the first direction than in a second direction, opposite the first direction.

In seventh examples, for any of the second examples, the dielectric material is a first dielectric material, the first transistor structure comprises a plurality of first terminal contacts spaced apart by one or more second dielectric materials, the first metal feature is one of the first plurality of terminal contacts, and the second metal feature is in contact with at least one of the one or more dielectric materials.

In eighth examples, for any of the seventh examples the IC structure further comprises a third dielectric material over at least one of the plurality of first terminal contacts, wherein the second metal feature is in contact with the third dielectric material, and wherein the second metal feature is separated from one of the plurality of first terminal contacts by at least the third dielectric material.

In ninth examples, for any of the seventh examples the first metal feature is a first gate electrode, the first gate electrode adjacent to the first lateral width of the first channel semiconductor material sidewall. The second metal feature is a second gate electrode, the second gate electrode adjacent to the second lateral width of the second channel semiconductor material sidewall, and the plurality of first terminal contacts further comprises a first source terminal contact and a first drain terminal contact.

In tenth examples, for any of the seventh examples, the first metal feature is a first source or drain terminal contact, the first source or drain terminal contact adjacent to the first lateral width of the first source or drain semiconductor material sidewall. The second metal feature is a second source or drain terminal contact, the second source or drain terminal contact adjacent to the second lateral width of the second semiconductor material sidewall. The plurality of first terminal contacts further comprises a first gate electrode.

In eleventh examples, for any of the first through tenth examples the semiconductor material sidewall comprises a single crystalline material comprising one or more Group IV majority lattice constituents.

In twelfth examples, for any of the first through eleventh examples the semiconductor material sidewall comprises a polycrystalline or amorphous material comprising predominantly one or more Group IV elements, or a compound of predominantly oxygen and one or more metals.

In thirteenth examples, a computer system comprises a power supply, and a processor IC die coupled to the power supply. The processor IC die comprises a first device level comprising a first transistor structure having a first metal feature adjacent to a first lateral width of a first channel, source, or drain semiconductor material sidewall. A second device level comprises a second transistor structure having a second metal feature over a second lateral width of a second channel, source, or drain semiconductor material sidewall. A dielectric material between the first and second device levels, wherein an electrical interconnect coupling the first and second metal features through the dielectric material has a lateral width that increases, with distance from the second device level, by a greater amount in a first dimension than in a second, orthogonal, dimension, and wherein the first dimension is substantially parallel to the first and second lateral widths.

In fourteenth examples, for any of the thirteenth examples the first and second transistor structures each comprise monocrystalline semiconductor material.

In fifteenth examples, for any of the thirteenth examples the first and second transistor structures each comprise polycrystalline semiconductor material.

In sixteenth examples, a method of fabricating an IC structure comprises receiving a workpiece comprising a first transistor structure comprising a first metal feature adjacent to a first lateral width of a first channel, source, or drain semiconductor material sidewall. The workpiece comprises a dielectric material over the first transistor structure, and a second transistor structure over the dielectric material. The second transistor structure comprises a second lateral width of a second channel, source, or drain semiconductor material sidewall. The method comprises exposing the first metal feature by etching an asymmetric opening through the dielectric material in alignment with the second lateral width of the second channel, source, or drain semiconductor material sidewall, wherein the opening has a lateral width that increases by a greater amount in a first dimension parallel to the second lateral width, than in a second, orthogonal, dimension. The method comprises depositing a metal into the opening.

In seventeenth examples, for any of the sixteenth examples the etching comprises orienting the workpiece to be non-normal relative to a directional ion flux.

In eighteenth examples, for any of the seventeenth examples the orienting comprises at least one of tilting the workpiece or the directional ion flux within the first dimension without tilting within the second dimension.

In nineteenth examples, for any of the eighteenth examples the tilting is between 10 and 30 degrees off-axis of the directional ion flux.

In twentieth examples, for any of the sixteenth examples the etching comprising generating the directional ion flux by energizing an inductively coupled plasma source or an ion beam source.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
  a first transistor structure comprising a first metal feature adjacent to a first lateral width of a first channel, source, or drain semiconductor material sidewall;
  a dielectric material over the first transistor structure; and
  a second transistor structure over the dielectric material, the second transistor structure comprising a second metal feature over a second lateral width of a second channel, source, or drain semiconductor material sidewall, wherein:
    the second metal feature extends through the dielectric material and is in contact with the first metal feature;
    the second metal feature has an outer lateral width that increases with depth in the dielectric material by a greater amount in a first dimension than in a second, orthogonal, dimension; and
    the first dimension is substantially parallel to the first and second lateral widths.

2. The IC structure of claim 1, wherein within the first dimension, the outer lateral width of the second metal feature increases from the first lateral width to a second lateral width that is at least 50% larger than the first lateral width.

3. The IC structure of claim 2, within the second dimension, the outer lateral width of the second metal feature increases from a third lateral width to a fourth lateral width that is no more than 10% larger than the first lateral width.

4. The IC structure of claim 3, wherein the fourth lateral width is smaller than the third lateral width by at least 10% of the third lateral width.

5. The IC structure of claim 3, wherein the outer lateral width increases within the first dimension asymmetrically from a center of the second lateral width, and wherein the outer lateral width varies within the second dimension symmetrically from a center of the third lateral width.

6. The IC structure of claim 5, wherein the center of the second lateral width is laterally offset in a first direction from a center the first lateral width, and the outer lateral width increases more in the first direction than in a second direction, opposite the first direction.

7. The IC structure of claim 2, wherein:
  the dielectric material is a first dielectric material;

the first transistor structure comprises a plurality of first terminal contacts spaced apart by one or more second dielectric materials;

the first metal feature is one of the first plurality of terminal contacts; and the second metal feature is in contact with at least one of the one or more dielectric materials.

8. The IC structure of claim 7, further comprising a third dielectric material over at least one of the plurality of first terminal contacts, wherein the second metal feature is in contact with the third dielectric material, and wherein the second metal feature is separated from one of the plurality of first terminal contacts by at least the third dielectric material.

9. The IC structure of claim 7, wherein:

the first metal feature is a first gate electrode, the first gate electrode adjacent to the first lateral width of the first channel semiconductor material sidewall;

the second metal feature is a second gate electrode, the second gate electrode adjacent to the second lateral width of the second channel semiconductor material sidewall; and the plurality of first terminal contacts further comprises a first source terminal contact and a first drain terminal contact.

10. The IC structure of claim 7, wherein:

the first metal feature is a first source or drain terminal contact, the first source or drain terminal contact adjacent to the first lateral width of the first source or drain semiconductor material sidewall;

the second metal feature is a second source or drain terminal contact, the second source or drain terminal contact adjacent to the second lateral width of the second semiconductor material sidewall; and the plurality of first terminal contacts further comprises a first gate electrode.

11. The IC structure of claim 1, wherein the semiconductor material sidewall comprises a single crystalline material comprising one or more Group IV majority lattice constituents.

12. The IC structure of claim 1, wherein the semiconductor material sidewall comprises a polycrystalline or amorphous material comprising predominantly one or more Group IV elements, or a compound of predominantly oxygen and one or more metals.

13. A computer system, comprising:

a power supply; and a processor IC die coupled to the power supply, the processor IC die comprising:

a first device level comprising a first transistor structure having a first metal feature adjacent to a first lateral width of a first channel, source, or drain semiconductor material sidewall;

a second device level comprising a second transistor structure having a second metal feature over a second lateral width of a second channel, source, or drain semiconductor material sidewall; and a dielectric material between the first and second device levels, wherein an electrical interconnect coupling the first and second metal features through the dielectric material has an outer lateral width that increases, with distance from the second device level, by a greater amount in a first dimension than in a second, orthogonal, dimension, and wherein the first dimension is substantially parallel to the first and second lateral widths.

14. The computer system of claim 13, wherein the first and second transistor structures each comprise monocrystalline semiconductor material.

15. The computer system of claim 13, wherein the first and second transistor structures each comprise polycrystalline semiconductor material.

16. A method of fabricating an IC structure, the method comprising:

receiving workpiece comprising:

a first transistor structure comprising a first metal feature adjacent to a first lateral width of a first channel, source, or drain semiconductor material sidewall;

a dielectric material over the first transistor structure; and a second transistor structure over the dielectric material, the second transistor structure comprising a second lateral width of a second channel, source, or drain semiconductor material sidewall;

exposing the first metal feature by etching an asymmetric opening through the dielectric material in alignment with the second lateral width of the second channel, source, or drain semiconductor material sidewall, wherein the opening has an outer lateral width that increases by a greater amount in a first dimension parallel to the second lateral width, than in a second, orthogonal, dimension; and depositing a metal into the opening.

17. The method of claim 16, wherein the etching comprises orienting the workpiece to be non-normal relative to a directional ion flux.

18. The method of claim 17, wherein the orienting comprises at least one of tilting the workpiece or the directional ion flux within the first dimension without tilting within the second dimension.

19. The method of claim 18, wherein the tilting is between 10 and 30 degrees off-axis of the directional ion flux.

20. The method of claim 18, further comprising generating the directional ion flux by energizing an inductively coupled plasma source or an ion beam source.

* * * * *